United States Patent
Taleb

(10) Patent No.: US 8,340,450 B2
(45) Date of Patent: Dec. 25, 2012

(54) SUCCESSIVELY REFINABLE LATTICE VECTOR QUANTIZATION

(75) Inventor: Anisse Taleb, Kista (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 1005 days.

(21) Appl. No.: 11/991,539

(22) PCT Filed: Sep. 12, 2006

(86) PCT No.: PCT/SE2006/001043
§ 371 (c)(1),
(2), (4) Date: Jan. 26, 2009

(87) PCT Pub. No.: WO2007/035148
PCT Pub. Date: Mar. 29, 2007

(65) Prior Publication Data
US 2009/0175550 A1    Jul. 9, 2009

Related U.S. Application Data

(60) Provisional application No. 60/719,554, filed on Sep. 23, 2005.

(51) Int. Cl.
*G06K 9/00* (2006.01)
*H03M 7/00* (2006.01)
*H03M 7/38* (2006.01)

(52) U.S. Cl. .................. 382/253; 341/106; 341/51

(58) Field of Classification Search .................. 382/253; 348/414, 417, 418, 422
See application file for complete search history.

(56) References Cited

U.S. PATENT DOCUMENTS

| | | | | |
|---|---|---|---|---|
| 6,125,201 | A * | 9/2000 | Zador | 382/166 |
| 6,516,297 | B1 * | 2/2003 | Servetto et al. | 704/222 |
| 6,594,627 | B1 * | 7/2003 | Goyal et al. | 704/222 |
| 2003/0081691 | A1 * | 5/2003 | Sutskover et al. | 375/286 |
| 2005/0256969 | A1 * | 11/2005 | Yancey et al. | 709/238 |

FOREIGN PATENT DOCUMENTS

| | | |
|---|---|---|
| WO | WO 03/103151 | 12/2003 |
| WO | WO 03103151 A1 * | 12/2003 |

OTHER PUBLICATIONS

Conway J.H., Sloane N.J.A. "*Fast Quantizing and Decoding Algorithms for Lattice Quantizers and Codes*", IEEE Transactions on Information Theory, vol. IT-28, No. 2, Mar. 1982, pp. 227-232.

(Continued)

Primary Examiner — Atiba O Fitzpatrick
Assistant Examiner — Jhere Rowland
(74) Attorney, Agent, or Firm — Nixon & Vanderhye, P.C.

(57) ABSTRACT

A vector quantizer includes a lattice quantizer (10) approximating a vector x by a lattice vector belonging to a lattice $\Lambda_0$. A lattice vector decomposer (14) connected to the lattice quantizer successively decomposes the lattice vector into a sequence of quotient vectors y, and a sequence of remainder vectors $r_i$ on successive lattices $\Lambda_{i-1}$ by lattice division with a corresponding predetermined sequence of integers $p_i \geq 2$, where i=1 ... k and k is a positive integer representing the number of elements in each sequence.

15 Claims, 7 Drawing Sheets

OTHER PUBLICATIONS

Adoul J.-P., Lamblin C., Leguyader A. *"Baseband Speech Coding at 2400 bps Using Spherical Vector Quantization"*, Proc. ICASSP 1984, pp. 1.12.1-1.12.4.

Conway J.H., Sloane N.J.A. *"A Fast Encoding Method for Lattice Codes and Quantizers"*, IEEE transactions on Information Theory, vol. IT-29, No. 6, Nov. 1983, pp. 820-834

S.N. Diggavi, N.J.A. Sloane, V.A. Vaishampayan, *"Asymmetric Multiple Description Lattice Vector Quantizers"*, IEEE Transactions on Information Theory, vol. 48, No. 1, Jan. 2002, pp. 174-191.

Rault P., Guillemot C. "Indexing Algorithms for Zn, An, Dn and Dn++ Lattice Vector Quantizers". IEEE transactions on Multimedia. Vol. 3, No. 4, Dec. 2001, pp. 395-404.

International Search Report for PCT/SE2006/001043 mailed Mar. 5, 2007.

Debargha, Mukherjee et al., "Successive Refinement Lattice Vector Quantization," IEEE Transactions on Image Processing, IEEE Service Center, vol. 11, No. 12, (2002).

Jianping, Pan et al., "Vector Quantization-Lattice Vector Quantization of Speech LPC Coefficients," Acoustics, Speech, and Signal Processing, (1994), pp. 1-513.

Sampson, D., et al., "Fast Lattice-Based Gain-Shape Vector Quantisation for Image-Sequence Coding," IEE Proceedings I. Solid-State & Electron Devices, Instit. Elec. Engrs., vol. 140, No. 1, (1993), pp. 56-66.

Hahm, Cheul-Hee, et al., "Overload Vector Quantisation by Selective Shell Projection in Lattice VQ," Electronics Letters, IEE Stevenage, GB, vol. 32, No. 24, (1996), pp. 2207-2209.

Minjie, Xie et al., "Embedded Algebraic Vector Quantizers (EAVQ) with Application to Wideband Speech Coding," International Conference on Acoustics, Speech, and Signal Processing-Proceedings (ICASSP), (1996), pp. 240-243.

\* cited by examiner (a)

(b)

(c)

(d)

SUCCESSIVELY REFINABLE LATTICE VECTOR QUANTIZATION

This application is the U.S. national phase of International Application No. PCT/SE2006/001043, filed 12 Sep. 2006, which designated the U.S. and claims priority to U.S. Provisional Patent Application No. 60/719,554, filed 23 Sep. 2005, the entire contents of each of which are hereby incorporated by reference.

TECHNICAL FIELD

The present invention relates generally to successively refinable lattice vector quantization.

BACKGROUND

Today there is a high market need to transmit and store audio and video content at low bit rates, while maintaining high quality. Particularly, in cases where transmission resources or storage is limited, low bit rate operation is an essential cost factor. This is typically the case, for example, in streaming and messaging applications in mobile communication systems such as GSM, UMTS, or CDMA. On the other hand, most content, for instance on the Internet, is available only at high bitrates, which guarantees the highest quality but which cannot be streamed directly over mobile networks. In order for a content provider to distribute the content over a wide variety of networks, e.g. broadcast, the content has to be available in several formats at different bitrates or rate transcoded at some network gateway if and when the need arises.

A prior art technique solution to this problem is the use of scalable codecs. The basic idea with scalable codecs is that the encoding is done only once, resulting in a scalable bitstream including a basic layer and one or several enhancement layers. When truncating the bitstream, i.e. lowering the bitrate, by discarding at least one of the enhancement layers, the decoder is still able to decode the data at a lower rate. With this technology, rate transcoding becomes a simple truncation operation.

An interesting application for a scalable codec is audiovisual content distribution over heterogeneous networks, e.g. Mobile TV, Video Broadcast, Video-on-Demand, Concert streaming, etc. For such a service to be successful, it is very desirable that the content distribution should be as broad and as easy as possible. At the same time a certain minimum service quality should be guaranteed for the most adverse channel links, i.e. a minimum acceptable quality for links with poor bandwidth.

Scalable audio and video codecs are gaining more and more interest in standardization bodies like MPEG (Moving Picture Experts Group). In fact, MPEG is currently standardizing a scalable extension to the standard H264/AVC (Advanced Video Coding) as well as issuing a Call for Information on scalable audio and speech codecs. Other standardization bodies such as DVB (Digital Video Broadcasting) are also considering uses for SVC (scalable AVC).

Although scalable audio codecs already exist and have been standardized, e.g. BSAC (Bit Sliced Arithmetic Coding), which is used in association with AAC (Advanced Audio Coding), MPEG, as an expert group, still feels the need for new technology that can fill the existing gap at low bitrates. In fact, it is a well-known problem that scalable codecs always have a performance that is worse at a given bitrate than a non-scalable codecs at the same rate.

One prior art encoding of speech, and in general of audio signals, is based on transform coding. According to this method an original input signal is divided into successive overlapping blocks of samples (frames). A linear transform, such as the DFT (Discrete Fourier Transform) or the MDCT (Modified Discrete Cosine Transform), is applied on each frame, thus generating transform coefficients. These coefficients are quantized and yield quantized coefficients, which in turn are encoded and form part of the bitstream. The bitstream is stored or transmitted depending on the sought application. Upon reception of the bitstream, the decoder first decodes the previously encoded quantized coefficients and performs the inverse transform, such as IDFT or IMDCT, yielding decoded frames. The decoded frames are usually combined by the so-called overlap-add procedure in order to generate the decoded time-domain signal.

Vector Quantization (VQ) is a well-known quantization technique where several coefficients are grouped together into a vector. The resulting vector is approximated by an entry of a codebook. Depending on the distortion measure that is used, the nearest neighbor in the codebook is selected as the approximate to the input vector of coefficients. The larger the codebook, the better is the approximation, thus yielding lower overall distortion. However, this comes at the expense of increased storage, bitrate and computational complexity.

Codebooks for vector quantization may have different structures and can be designed in several ways.

One way to design a codebook for unstructured vector quantization is by using the well-known LBG (Linde-Buzo-Gray) algorithm (K-means). Unstructured codebooks are optimal in the sense that they are trained on the data and thus are tailored to the distribution of the vectors to be quantized. However, this optimality comes at the expense of an exhaustive search in order to find the nearest neighbor as well as huge storage requirements; both grow exponentially with the quantizer bitrate.

An alternative to unstructured vector quantization is the use of structured vector quantizers which are structurally constrained vector quantizers.

Multistage vector quantization is a form of tree structured quantization with much more reduced arithmetic and storage complexity. Instead of having a large codebook for a given rate, Multistage VQ starts by quantizing the vector with a reduced rate codebook. The residual of this first quantization stage is then fed to the second stage where another (or the same) codebook is used to quantize the residual, possibly at a different rate. This process is iterated for all stages yielding the final quantization error. The total rate of the quantizer is the sum of the rates of each quantizer stage.

In multistage vector quantization, a source vector x is quantized with a first-stage codebook $CB_1$ yielding a codevector $c_1(i_1)$ with index $i_1$. The residual error of the first stage is computed as $e_1 = x - c_1(i_1)$ and is quantized by the second stage using codebook $CB_2$ yielding a codevector $c_2(i_2)$ with index $i_2$. This process is re-iterated with the following stages until the residual $e_{n-1} = e_{n-2} - c_{n-1}(i_{n-1})$ is input to the last stage and quantized with codebook $CB_n$ yielding the codevector $c_n(i_n)$ with index $i_n$.

Reconstruction of the source vector consists of performing the inverse operation of the quantizer; upon reception of indices $i_1, i_2, \ldots, i_n$ the decoder computes a reconstructed vector given by:

$$\hat{x}(i_1, i_2, \ldots, i_n) = c_1(i_1) + c_2(i_2) + \ldots + c_n(i_n) \qquad (1)$$

The overall bitrate used to encode x is the sum of the bitrates of each stage. Besides the savings in computational complexity, multistage vector quantizers also provide a way to encode a vector in a successively refinable fashion.

In case only part of the indices are received, for examples, $i_1, i_2, \ldots, i_k$, k<n, then it is still possible to reconstruct a vector:

$$\hat{x}(i_1, i_2, \ldots, i_k) = c_1(i_1) + c_2(i_2) + \ldots + c_k(i_k) \quad (2)$$

which has a higher quantization error, i.e. lower performance, but which requires a lower bitrate. Thus, each additional received index improves the reconstructed vector.

Despite its advantages over normal unconstrained VQ, multistage VQ has several limitations:

Multistage vector quantization becomes quite complex when high rate quantization steps (i.e. large codebooks) are required.

Storage of the codebooks is proportional to the number of stages, thus limiting the flexibility of successive refinement.

The property of successive improvement implies constraints on the successive quantization steps, which limits the overall achievable performance at any rate.

Another type of structured VQ is Lattice Vector Quantization (LVQ). In LVQ, codebooks are formed using a subset of points in a given lattice. A lattice is a geometrical object constructed as an integer linear combination of a set of basis vectors. The low complexity and memory consumption make the use of lattices for quantization very attractive. However, there are still several issues affecting their performance and complexity:

For variable-rate encoding, one must scale the lattice (base vectors) in order to obtain the desired distortion and rate, additionally, one has to encode the resulting indices with a lossless encoder.

For fixed rate encoding, shaping must be used in order to define a certain codebook and also scale the lattice such that most of the input vectors (called the support) lie within the defined shaping region. Vectors outside the shaping region, also called outliers, cause a very serious problem, which may be solved by saturation or by scaling. Both techniques add an additional computational burden and may degrade quality, especially in the case of large outliers.

Each point c in a lattice of dimension d can be written as c=Gm, where G is called the generator matrix and m is a vector of integers. Several popular lattices exist, for example, the hexagonal lattice $A_2$, the integer lattice $Z_n$, and the Gosset lattice $E_n$.

When a lattice is chosen to design a quantizer of a certain rate, only a subset of lattice points are retained in order to form a codebook with a certain number of bits. A well-known technique is the so-called shaping of the lattice. This technique consists of truncating the lattice according to a shape boundary. The shape boundary is centered on some point (origin) and may take any shape, e.g. rectangular, spherical, or pyramidal, voronoi, etc.

Using lattices for quantization allows for very efficient nearest neighbor search algorithms. Such search algorithms may be found in [1] for the most useful lattices. On the other hand, when using lattices for quantization, there is virtually no need to store the codebook, since lattice points can be obtained directly from the generator matrix.

When a lattice point is found, a further task consists of indexing the lattice point. Several indexing algorithms have been devised. An interesting class of indexing algorithms employ the concept of leaders, which is described for instance in [2, 3]. This type of indexing is best used when using spherical shaping.

Another type of shaping is voronoi shaping, which is described in [4] and relies on the concept of voronoi regions.

Indexing and recovery of code vectors in a voronoi codebook can be done very efficiently using integer modulo operations, as described in [4].

The technique described in [5] uses voronoi coding in order to extend lattice quantization by successive refinements. This technique is quite similar to Multistage VQ with the conventional codebooks replaced by lattice codebooks. The essence of this technique is based on generating a series of decreasing scale voronoi lattice VQ's each covering the voronoi region of the base lattice at the previous higher scale. This technique, however, suffers from the problem of outliers, especially if an outlier occurs in the first stages. In fact, the successive stages are designed to reduce granular noise and therefore cannot efficiently deal with outliers. Another problem of this technique comes from the quantizer efficiency, since codebook entries of a subsequent stage do not efficiently cover the distribution of previous stages.

A technique described in [6] uses a multi-rate lattice quantization method for encoding lattice points. The technique relies on the concept of codebook extension. Whenever a quantized vector does not fall into a base codebook, the base codebook is itself extended in order to be able to index the quantized vector. This technique is in nature a variable rate technique.

Reference [7] describes a symmetric multi-description lattice vector quantizer. A labeling function is used in order to split the quantized vector into two redundant descriptions that are stored in two different streams. A similar technique is developed in [8] for asymmetric lattice vector quantization. These techniques have several drawbacks, such as:

Since the objective of multiple descriptions is to be able to decode each description separately, a certain amount of redundancy is carried in each description, this in turn would make the use of multiple descriptions highly inefficient in successively refinable quantizers.

The design of the optimal labeling function is a tedious task, which requires linear programming techniques.

The labeling function needs to store an index matching lookup table, thus if several matching functions are needed, then this would increase memory requirements.

SUMMARY

The technology disclosed herein improves successively refinable lattice vector quantization and encoding as well as decoding of the resulting layered code.

This object is achieved in accordance with the attached claims.

Briefly, the vector quantization starts by approximating a vector x by a lattice vector belonging to a lattice $\Lambda_0$. Thereafter the lattice vector is successively decomposed into a sequence of quotient vectors $y_i$ and a sequence of remainder vectors $r_i$ on successive lattices $\Lambda_{i-1}$ by lattice division with a corresponding predetermined sequence of integers $p_i \geq 2$, where i=1 . . . k and k is a positive integer representing the number of elements in each sequence.

The encoding involves coding each remainder vector $r_i$ in a corresponding voronoi codebook $V_{\Lambda_{i-1}}(p_i, a_i)$, where $a_i$ is a predetermined displacement vector belonging to the voronoi region $V_{\Lambda_{i-1}}(0)$ of lattice $\Lambda_{i-1}$, and representing the vector x by said coded remainder vectors $r_i$, the number k of such remainder vectors $r_i$ and the sequence of integers $p_i$ and displacement vectors $a_i$ defining the voronoi codebooks $V_{\Lambda_{i-1}}(p_i, a_i)$.

Decoding involves reconstructing an approximation y of the vector x in accordance with:

$$y = \sum_{i=1}^{l}\left(\prod_{j=1}^{i-1} p_j\right)\bar{r}_i + \sum_{i=l+1}^{k}\left(\prod_{j=1}^{i-1} p_j\right)r_i.$$

where $1 \leq k$ is a positive integer representing a number of missing coded remainder vectors and $\bar{r}_i$, $i=1 \ldots l$ are the average vectors of the corresponding voronoi codebooks.

BRIEF DESCRIPTION OF THE DRAWINGS

The technology disclosed herein, together with further objects and advantages thereof, may best be understood by making reference to the following description taken together with the accompanying drawings, in which.

DETAILED DESCRIPTION

Since the concept of a voronoi codebook is essential to the technology disclosed herein, voronoi codebooks will be discussed in some detail with reference to FIGS. 1 and 2. A voronoi codebook $C_\Lambda(r,a)$ is formed by taking all lattice points that fall inside a scaled and translated voronoi region, i.e.

$$C_\Lambda(r,a) = \Lambda \cap (rV_\Lambda(0)+a) \quad (1)$$

where, $\Lambda$: denotes the lattice.

$V_\Lambda(0)$: denotes the voronoi region around the origin associated with the lattice $\Lambda$.

r: denotes a positive integer scaling factor.

a: denotes a vector chosen such that no lattice points fall on the border of $rV_\Lambda(0)+a$.

Figure 1:
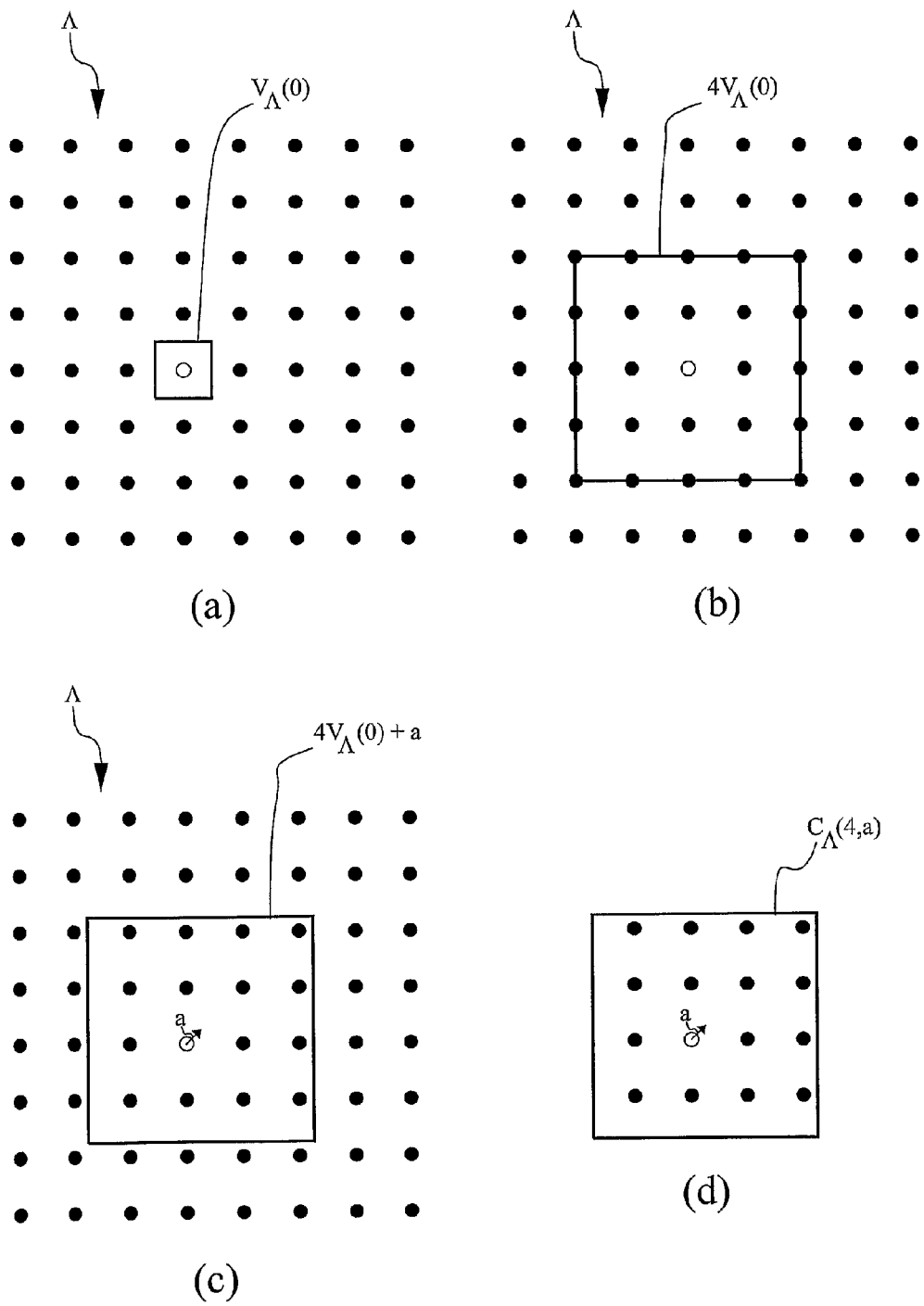
FIG. 1(a)-(d) illustrates the concept of a voronoi codebook for an integer lattice $Z_2$.
Figure 2:
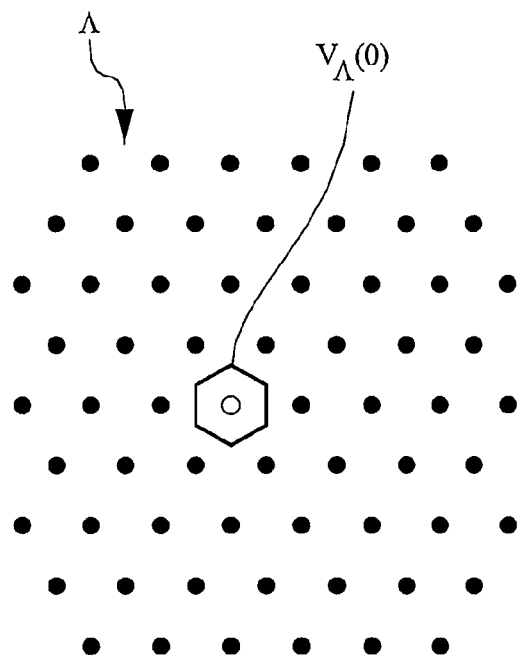
FIG. 2(a)-(d) illustrates the concept of a voronoi codebook for a hexagonal lattice $A_2$.
Figure 2:
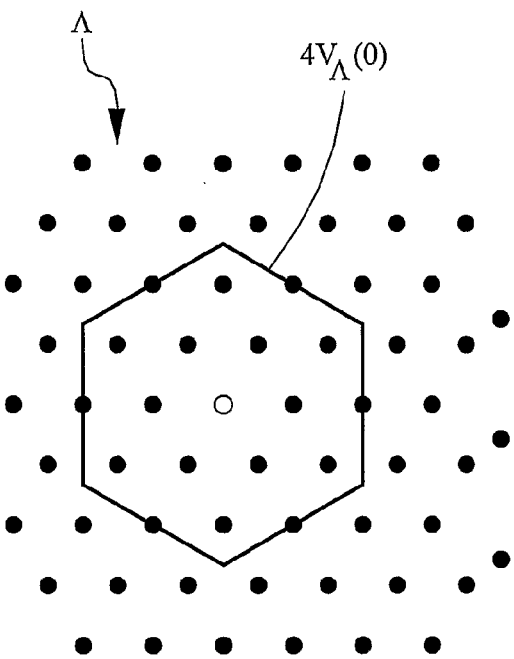
Figure 2:
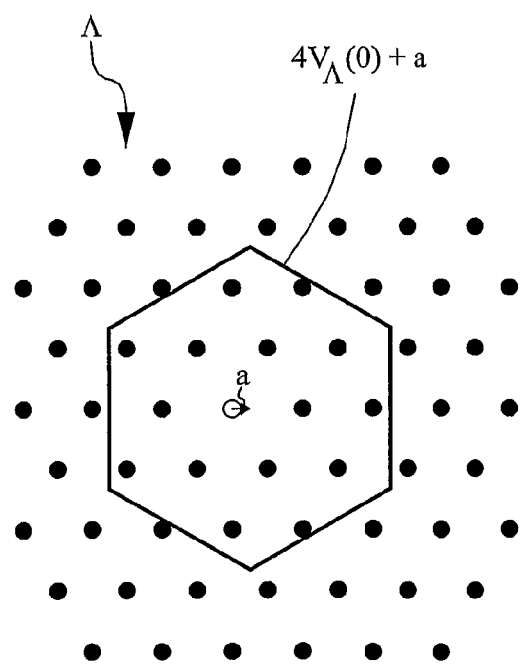
Figure 2:
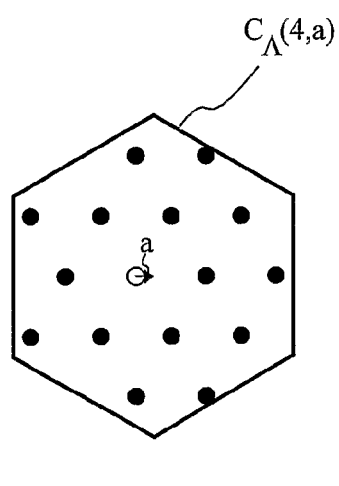

Equation (3) is illustrated for an integer lattice $Z_2$ by the sequence (a)-(d) in FIG. 1. FIG. 1(a) illustrates the entire lattice $\Lambda$ (only a part of the lattice is shown, since the lattice extends over the entire plane). One lattice point is chosen as the origin and is denoted by a ring in FIG. 1(a). The voronoi region $V_\Lambda(0)$ around the origin is also illustrated. The scaled voronoi region $rV_\Lambda(0)$ is illustrated in FIG. 1(b). In this example r=4. In FIG. 1(b) it is noted that several lattice points fall on the border of $4V_\Lambda(0)$. For this reason the scaled voronoi region is displaced by a displacement vector a lying within the voronoi region $V_\Lambda(0)$, as illustrated in FIG. 1(c). This results in the scaled and displaced voronoi region $4V_\Lambda(0)+a$. Finally the voronoi codebook $C_\Lambda(4,a)$ is formed by taking the intersection between the lattice $\Lambda$ and the scaled and displaced voronoi region $4V_\Lambda(0)+a$, as illustrated in FIG. 1(d). It is noted that no points in the codebook fall on the border.

FIG. 2(a)-(d) illustrates a similar sequence for a hexagonal lattice $A_2$. It is appreciated that the same principles may be used for other and higher dimensional voronoi codebooks.

The total number of points belonging to a voronoi codebook $C_\Lambda(r,a)$ is $r^d$ which is equivalent to saying that the codebook has $\log_2 r$ bits/dimension.

The technology disclosed herein is based on lattice division, which is described in APPENDIX I. With lattice division a lattice vector y may be decomposed into a quotient vector q and a remainder vector r by dividing y with a positive integer p in accordance with:

$$y = pq + r \quad (2)$$

where $r \in C_\Lambda(p,a)$. The quotient q is a vector which may be decomposed into a further quotient and remainder, and this procedure may be repeated for obtaining smaller and smaller remainders. The algorithm may be summarized by the following pseudo code:

---

Given a set of integers, $p_1, p_2, \ldots$ all positive and $\geq 2$ and a set of vectors $a_1, a_2, \ldots \in V_\Lambda(0)$;
$y_i = p_{i+1}y_{i+1} + r_{i+1}$ with $r_{i+1} \in C_\Lambda(p_{i+1}, a_{i+1})$, for $i = 0, 1, \ldots$

---

Figure 3:
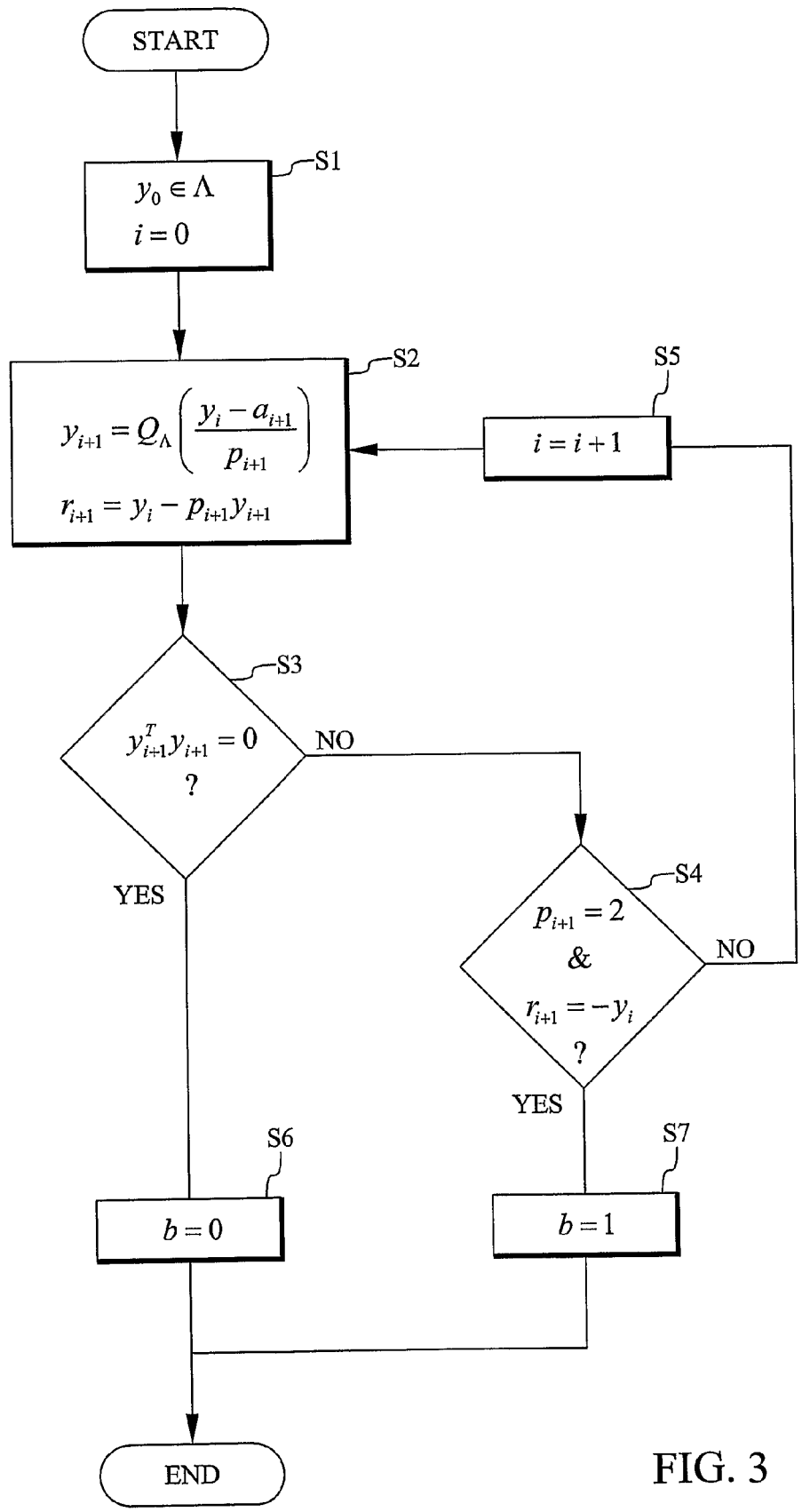
FIG. 3 is a flow chart illustrating an embodiment of the vector quantization method in accordance with the present invention.

A flow chart illustrating an implantation of this algorithm is shown in FIG. 3. The algorithm starts in step S1 by selecting a lattice vector $y_0$ and setting index i=0. Step S2 performs the iteration:

$$\begin{cases} y_{i+1} = Q_\Lambda\left(\dfrac{y_i - a_{i+1}}{p_{i+1}}\right) \\ r_{i+1} = y_i - p_{i+1}y_{i+1} \end{cases} \quad (5)$$

Step S3 tests whether $y_{i+1}^T y_{i+1} = 0$. If this is the case the algorithm has converged (see APPENDIX II), otherwise it proceeds to step S4. Step S4 tests whether $p_{i+1} = 2$ and $r_{i+1} = -y_i$. If this is the case the algorithm has converged (see APPENDIX II), otherwise it proceeds to step S5. In step S5 i is increased by 1, and thereafter the algorithm returns to step S2. Since there are two possible ways to reach convergence (in step S3 or in step S4), the final encoder state may be indicated by a sign bit b, which may be set to 0 if convergence was reached in step S3 and to 1 if convergence was reached in step S4, for example.

Figure 4:
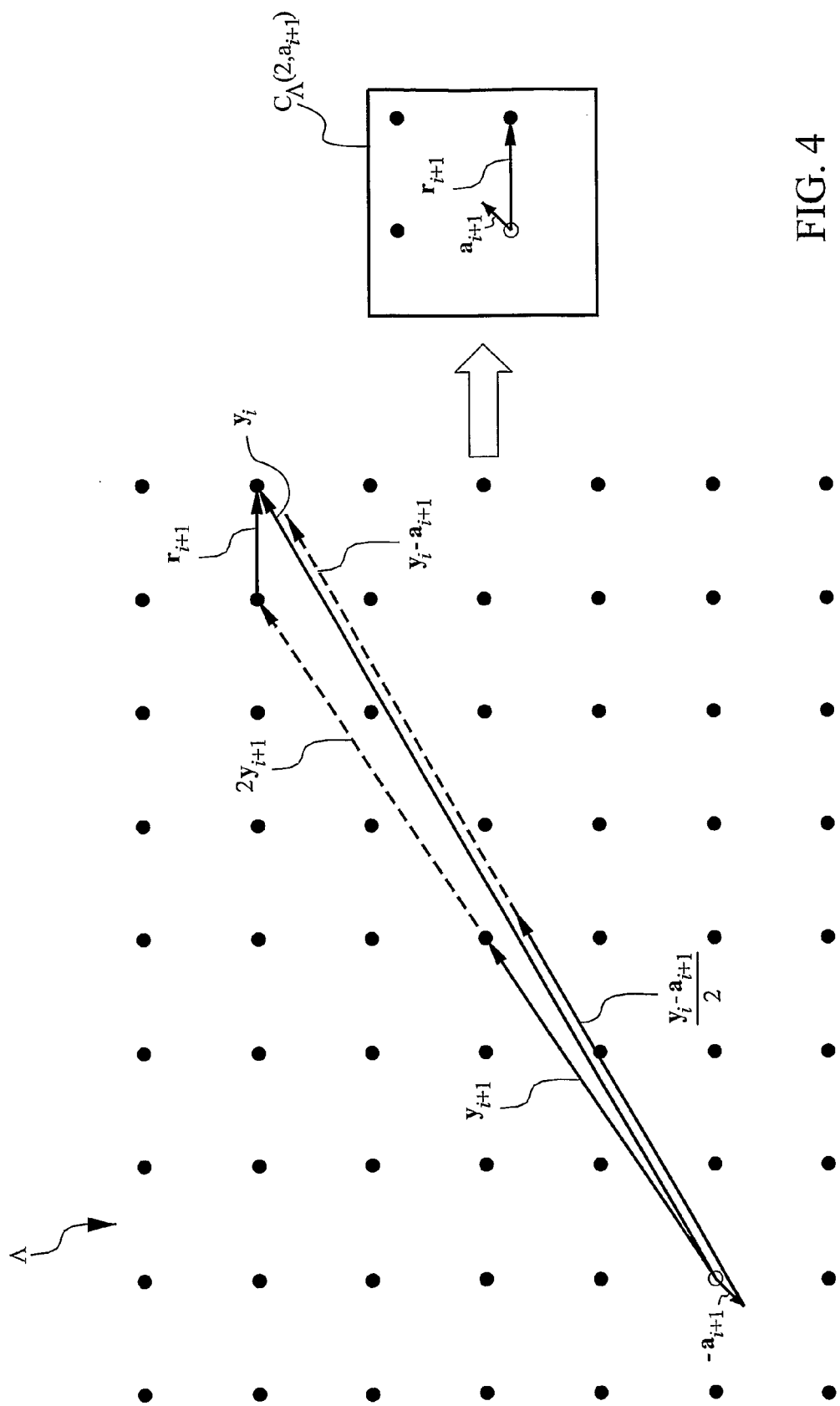
FIG. 4 illustrates one iteration of the vector quantization method of FIG. 3.

FIG. 4 is an illustration of the iteration step S2 in FIG. 3. The lattice vector $y_i$ and the vector $a_{i+1}$ lying within the voronoi region $V_\Lambda(0)$ form the dashed vector $y_i - a_{i+1}$. This vector is divided by the integer $p_{i+1}$, which equals 2 in this example, thereby forming the rescaled vector $(y_i - a_{i+1})/2$, which is quantized to the nearest lattice point to form the quotient vector $y_{i+1}$. The remainder vector $r_{i+1}$ is formed by $y_i - p_{i+1}y_{i+1}$, which is equal to $y_i - 2y_{i+1}$ in this example. The remainder $r_{i+1}$ belongs to the codebook $C_\Lambda(p_{i+1}, a_{i+1})$, which in this example is $C_\Lambda(2, a_{i+1})$, as illustrated in FIG. 4. This feature will be used for the actual encoding.

Encoding of a vector x of dimension d starts by selecting the nearest lattice vector $y = Q_\Lambda(x)$. This lattice vector is used as the initial vector $y_0$ in the lattice division defined in (5). Each division results in a remainder $r_i$ belonging to a corresponding voronoi codebook $C_\Lambda(p_i, a_i)$. Since the lattice division algorithm converges after a certain number k of iterations (APPENDIX II), this means that the lattice vector y may be expressed as a linear combination of the remainders $r_i$ in accordance with:

$$y = \sum_{i=1}^{k}\left(\prod_{j=1}^{i-1} p_j\right) r_i = \sum_{i=1}^{k} \lambda_i r_i \quad (6)$$

Equation (6) is obtained by unrolling the loop of algorithm (5) for k iterations. Here $\lambda_i$ represents the integer scaling factor corresponding to remainder vector $r_i$, i.e.

$$\lambda_i = \prod_{j=1}^{i-1} p_j.$$

In equation (6) the convention:

$$\lambda_1 = \prod_{j=1}^{0} p_j = 1$$

is used for the first term in the sum.

As shown in APPENDIX III the code vectors $r_i$ generated by this procedure are unique. It should be noticed that the layers are in reverse order. The first layer, which is the most important for decoding, is the one that has the highest integer scaling factor $\lambda_k$.

Figure 5:
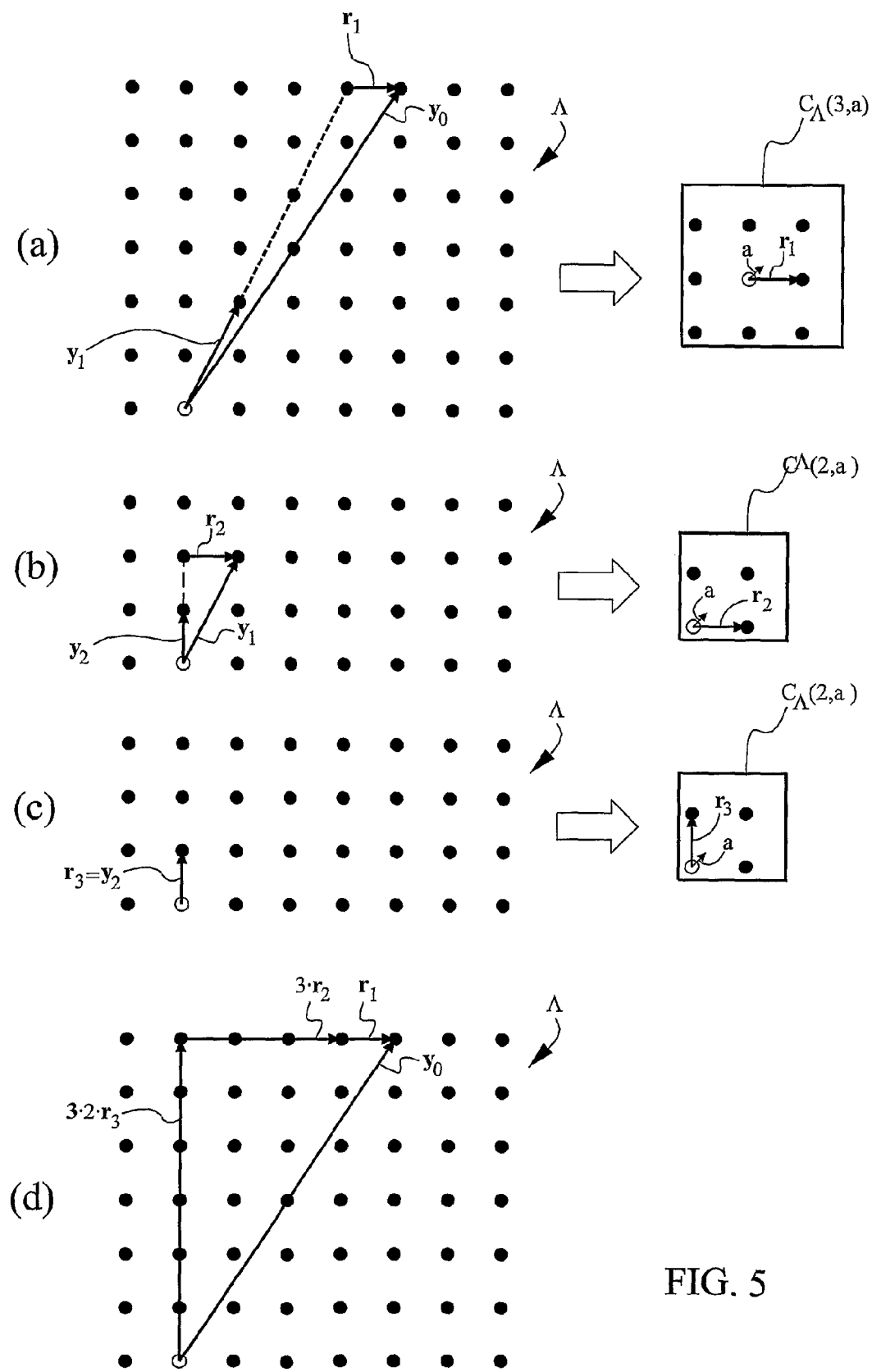
FIG. 5(a)-(d) illustrates an example of a vector quantization based on the method of FIG. 3.

FIG. 5 illustrates this process for a lattice $Z_2$. In FIG. 5(a) a lattice vector $y=y_0$ is lattice divided by the integer $p_1=3$. This results in a quotient vector $y_1$ and a remainder vector $r_1$ belonging to a voronoi codebook $C_\Lambda(3,a)$ (for simplicity the vector a is used in all codebooks in this example). In FIG. 5(b) lattice vector $y_1$ is lattice divided by the integer $p_2=2$. This results in a quotient vector $y_2$ and a remainder vector $r_2$ belonging to a voronoi codebook $C_\Lambda(2,a)$. In FIG. 5(c) lattice vector $y_2$ is lattice divided by the integer $p_3=2$. This results in a quotient vector $y_3=0$ and a remainder vector $r_3=y_2$ belonging to the voronoi codebook $C_\Lambda(2,a)$. Since $y_3=0$ condition S3 in FIG. 3 is fulfilled and the algorithm has converged in k=3 iterations. Applying (6) to this example gives (starting with the base layer k=3):

$$y=y_0=p_1 \cdot p_2 \cdot r_3 + p_1 r_2 + 1 \cdot r_1 = 3 \cdot 2 \cdot r_3 + 3 \cdot r_2 + r_1$$

as illustrated in FIG. 5(d).

Since each of the code vectors $r_1, \ldots, r_k$ belong to a voronoi code book, their indices may encoded using the well known algorithm described in [4], namely by deriving indices:

$$n_i = [G^{-1} r_i] \bmod p_i, \quad i = 1 \ldots k \quad (7)$$

where G is the generator matrix of the lattice and "mod" is the modulo function. Each index $n_i$ requires $d \log_2 (p_i)$ bits for encoding.

The indices $n_1, \ldots, n_k$ as well as their number k are the main coding parameters to be transmitted from the encoder to the decoder. Transmission of the number of layers is important, since the first (most important) layer is the one corresponding to index i=k and the last (least important) layer is the one corresponding to index i=1. The number of layers is also related to the energy of the vector y, and therefore can be seen as a kind of gain-shape coding.

It is also important to note that the state in which the lattice division algorithm has stopped may have to be transmitted as well. As described with reference to FIG. 3, this state may be represented as a binary variable b=0 or b=1 and is referred to as the sign bit. At the decoder, the sign bit indicates whether the code vector representing $y_{k+1}$ needs to be sign changed. However, it should be noted that the sign bit is only required if the sequence of integers $p_i \geq 2$ contains at least one $p_i = 2$, such that convergence may be reached through step S4 instead step S3. If all $p_i > 2$, and if this fact is known at the decoder, the sign bit is not required, since in this case convergence is always reached through step S3.

The parameters $p_1, \ldots, p_k$, which control the bit allocation of each layer as well as the displacement vectors $a_1, a_2, \ldots, a_k$, are also needed for decoding the remainder vectors $r_i$ and recovering the vector y. However, they may be predetermined and fixed in the encoder and decoder and therefore do not have to be transmitted. Generally the parameters $p_1, \ldots, p_k$ represent the granularity of each layer.

If one decides that each layer should have the same number of bits allocated, then all $p_i$ are equal. If this value does not change, it may be fixed in the encoder and decoder, otherwise only one value has to be transmitted. If it is decided that all layers should be encoded by d bits, then $p_i = 2$ for all i, hence no $p_i$ has to be transmitted.

As already discussed above, the displacement vectors $a_1, a_2, \ldots, a_k$ are selected such that they all belong to the voronoi region around the origin. They are selected to break ties in such a way that no lattice point lies on the boundary of $p_i V_\Lambda(0) + a_i$. They may also be predetermined and fixed in the encoder and decoder. In order to optimize the choice of these vectors, we have to examine the error related to each layer. The average mean square error (MSE) is:

$$MSE_y(k) = \sum_{i=1}^{k} \lambda_i^2 \sigma_i^2 \quad (8)$$

where $$\sigma_i^2 = \frac{1}{p_i^d} \cdot \sum_{r \in C_\Lambda(p_i, a_i)} (r - \bar{r}_l)^2$$

corresponds to the average energy of the code, and $$\bar{r}_l = \frac{1}{p_i^d} \cdot \sum_{r \in C_\Lambda(p_i, a_i)} r$$

denotes the average of the code vectors in the voronoi codebook $C_\Lambda(p_i, a_i)$. An optimal choice for the vectors $a_1, a_2, \ldots, a_k$ is then to make this error as small as possible. A simple generic algorithm for voronoi code energy optimization is described in [4] and can be used in this case to optimize each $\sigma_i^2$.

As indicated by equation (6) the received quantized vector y is reconstructed at the decoder as:

$$y = \sum_{i=1}^{k} \lambda_i r_i \qquad (9)$$

Decoding of the indices $n_1, \ldots, n_k$ into code vectors $r_1, \ldots, r_k$ is performed according to the following algorithm, which is described in [4]:

$$r_i = Gn_i - p_i Q_\Lambda \left( \frac{Gn_i - a_i}{p_i} \right), \quad i = 1 \ldots k \qquad (10)$$

where G is the generator matrix of lattice $\Lambda$.

Now, suppose that a number $1 \leq k$ of layers are missing, then an optimal reconstruction, in terms of mean square error minimization, is given by:

$$y_{OPT}(l) = \sum_{i=1}^{l} \lambda_i \bar{r}_i + \sum_{i=l+1}^{k} \lambda_i r_i \qquad (11)$$

which means that the missing code vectors $r_i \ldots r_l$ are replaced by the averages of their corresponding codebooks (if l=0, i.e. all layers have been received, the first sum in (11) is zero and (11) is reduced to (9)).

So far, the mean squared error has been computed only for the error in the recovery of the codevector y. However, since the target is the quantization of the vector x, then in addition to the error due to missing layers, one has to add the error associated with the quantization. This error is dependent on the shape of the voronoi region of the lattice, but is independent of the vector x and is given by:

$$\varepsilon^2 = \frac{\int_{V_\Lambda(0)} \|u\|^2 du}{\int_{V_\Lambda(0)} du} \qquad (12)$$

Several known lattices are obtained as a combination of other lattices, possibly of lower dimension. It is clear that the technology disclosed herein can equally be applied on these lattices. For instance, a simple modification of the lattice division algorithm allows it to deal with different lattices at each stage (layer):

---

Given a set of integers, $p_1, p_2, \ldots$ all positive and $\geq 2$ and a set of lattices $\Lambda_1, \Lambda_2, \ldots$, vectors $a_1, a_2, \ldots \in V_{\Lambda_1}(0), V_{\Lambda_2}(0), \ldots$;
$y_i = p_{i+1} y_{i+1} + r_{i+1}$ with $r_{i+1} \in C_{\Lambda_1}(p_{i+1}, a_{i+1})$, for $i = 0, 1, \ldots$

---

Adapting (5) to this generalization gives:

$$\begin{cases} y_{i+1} = Q_{\Lambda_i}\left( \frac{y_i - a_{i+1}}{p_{i+1}} \right) \\ r_{i+1} = y_i - p_{i+1} y_{i+1} \end{cases} \qquad (13)$$

The vectors $r_i$ are encoded as:

$$n_i = [G_{i-1}^{-1} r_i] \bmod p_i, \quad i = 1 \ldots k \qquad (14)$$

where $G_{i-1}$ is the generator matrix of the lattice $\Lambda_{i-1}$.

At the decoder the vectors $r_i$ are obtained from the received indices $n_i$ as:

$$r_i = G_{i-1} n_i - p_i Q_{\Lambda_{i-1}} \left( \frac{G_{i-1} n_i - a_i}{p_i} \right), \quad i = 1 \ldots k \qquad (15)$$

and the reconstructed vector y is obtained by (9) if all k indices (layers) have been received and by (11) if some indices have been truncated. The average codebook vectors are in this case formed by:

$$\bar{r}_i = \frac{1}{p_i^d} \cdot \sum_{r \in C_{\Lambda_{i-1}}(p_i, a_i)} r \qquad (16)$$

Each lattice $\Lambda_i$ must be such that $y_i \in \Lambda_i$. If this is not the case one could, however, make $y_i \in \Lambda_i$ provided some amount of additional side information is transmitted, such as a translation and/or scaling of $y_i$.

The advantage of using different lattices is that, besides the flexibility they provide, some lattices are better suited for certain problems than others. Furthermore, the use of different lattices allows achieving rate-distortion points which are not available by using only one lattice (on the average each additional layer corresponds to a predetermined reduction of the quantization distortion).

Figure 6:
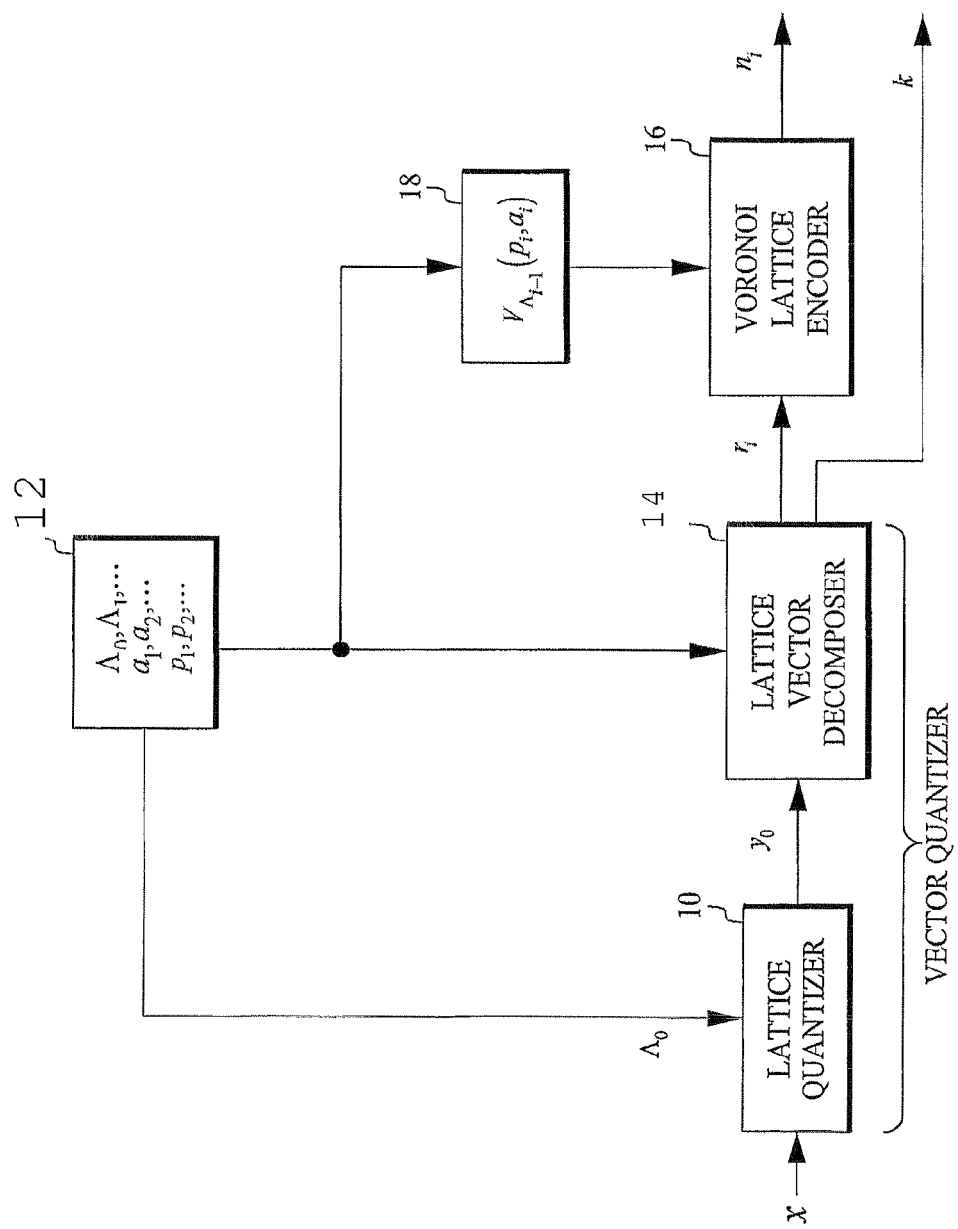
FIG. 6 is an embodiment of an encoder using the vector quantization method of the technology disclosed herein.

FIG. 6 is an embodiment of an encoder using the vector quantization method of the Itechnology disclosed herein. A lattice quantizer 10 receives a vector x to be vector quantized. It quantizes it to the nearest lattice point $y_0$ on a lattice $\Lambda_0$ obtained from a storage unit 12 (typically the lattice points are obtained from the stored generator matrix). The lattice vector $y_0$ is forwarded to a lattice vector decomposer 14 connected to lattice quantizer 10. There it is successively refined in accordance with the algorithm outlined in equation (13) by using sequences of lattices $\Lambda_0, \Lambda_1, \ldots$, displacement vectors $a_1, a_2, \ldots$ and positive integers $p_1, p_2, \ldots$ from storage unit 12. Finally the remainder vectors $r_i$ are forwarded to a voronoi lattice encoder 16 that encodes them in corresponding voronoi codebooks $C_{\Lambda_{i-1}}(p_i, a_i)$ from a voronoi codebook builder 18 forming the codebook from parameters retrieved from storage unit 12. The corresponding codes $n_i$ are formed in accordance with equation (14). In this embodiment these codes as well as the number k of them are sent or transmitted to the decoder (the sign bit b may also be required depending on the used sequence $p_i$, see the discussion above).

Figure 7:
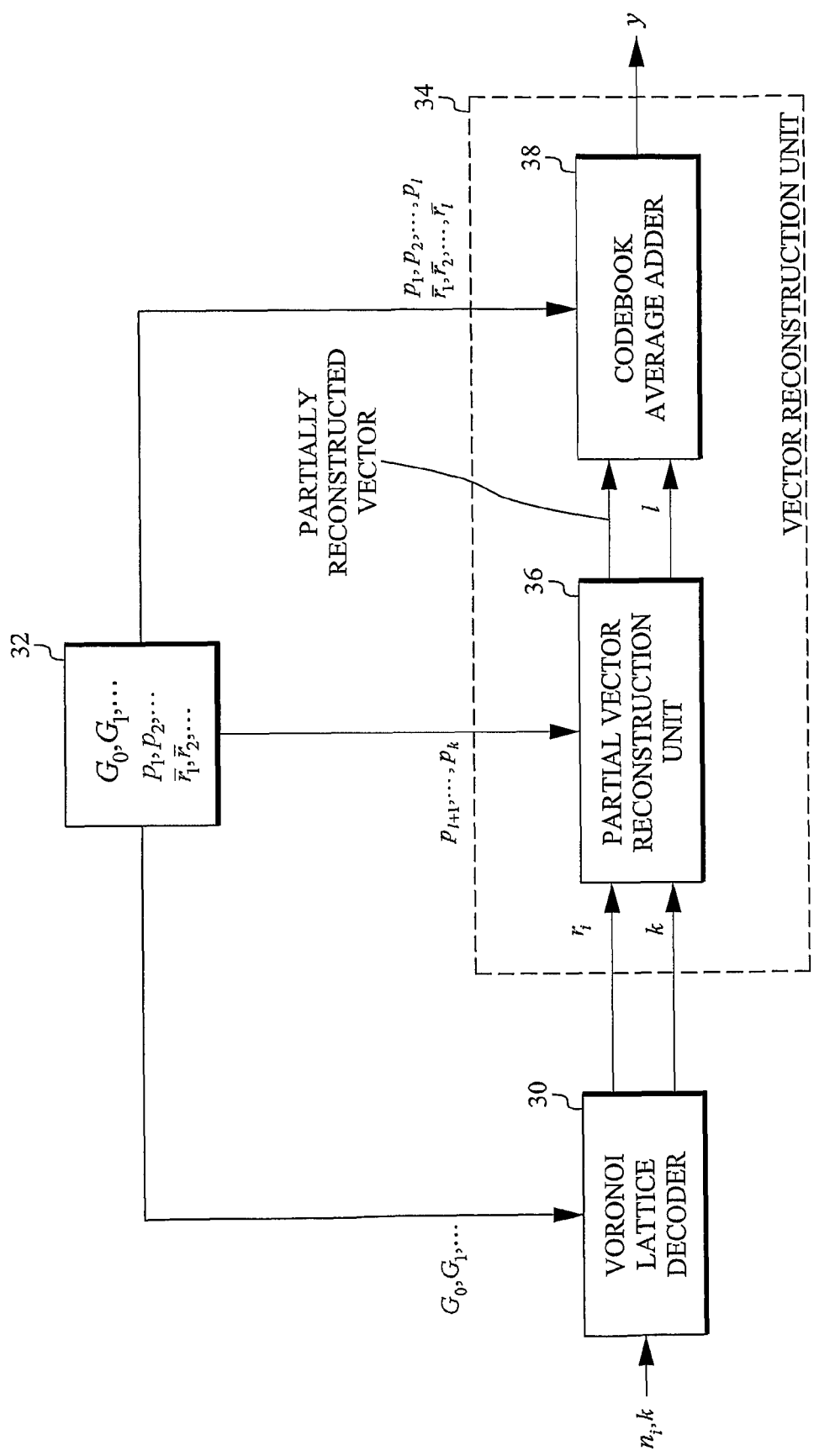
FIG. 7 is an embodiment of a decoder using the decoding method of the technology disclosed herein.

FIG. 7 is an embodiment of a decoder using the decoding method of the technology disclosed herein. The coding parameters $n_i$, k are received by a voronoi lattice decoder 30, which decodes the received indices $n_i$ into the remainder vectors $r_i$ by using equation (15). The generator matrices $G_{i-1}$ are obtained from a storage unit 32. The decoded vectors $r_i$ are forwarded to a vector reconstruction unit 36, which reconstructs the approximation y, given that $1 \leq k$ remainder vectors $r_i$ are missing, in accordance with (11). The reconstruction is divided into two steps. In a first step a partially reconstructed vector in accordance with the first sum in (11) is formed in a partial vector reconstruction unit 36, and in a second step the second sum of (11) is formed in a codebook average adder 38 and added to the first sum to form the decoded vector y.

The functionality of the various blocks of the described embodiments is typically achieved by one or several micro processors or micro/signal processor combinations and corresponding software. Another possibility is to implement the technology disclosed herein as an ASIC (Application Specific Integrated Circuit) or an FPGA (Field Programmable Gate Array).

It is clear that lossless encoding of each layer index $n_i$ could provide even more efficiency to the layered coding scheme described above. Typical techniques such as Huffman coding or Arithmetic coding are especially well suited for this task.

When a vector x is quantized to a lattice point y∈Λ, a higher energy of the vector x leads to a higher total number of bits required for encoding. Pre-scaling of the source vector x has a direct effect on the final MSE (Mean Squared Error) when all layers are received. If the source vector is scaled upwards, then the final MSE is decreased and vice versa. However, for a high-energy source vector, the total number of bits needed to represent the quantized vector y also grows. This, in general, is a trade-off, which is dependent on the application. For instance, for audio coding, it may be required that the final MSE corresponds to the masked noise threshold, thus leading transparent coding when all layers are received. If the source vector is scaled upwards, then the final MSE is decreased and vice versa. However, for a high-energy source vector, the total number of bits needed to represent the quantized vector y also grows. This, in general, is a trade-off, which is dependent on the application. For instance, in audio coding applications, masking thresholds are derived in the frequency domain after performing a psycho-acoustical analysis of the signal. These masking thresholds determine the level of coding noise that is just noticeable by the human ear. The objective of transparent lossy coding is then to encode the spectral coefficients such that the coding noise level is below the just noticeable noise level. This translates into choosing an appropriate scaling of the spectral coefficients leading to a final mean square error that matches the just noticeable noise level, thus leading to transparent coding when all layers are received.

As has been shown above, the basic idea of this invention is related to variable rate lattice vector quantization. In particular, the concept of this invention is to use a lattice division algorithm to encode a source vector in a flexible successively refinable manner by using voronoi codes. Each refinement layer consists of a codevector belonging to a certain voronoi codebook. The choice of the size of each refinement layer is flexible in the sense that each refinement voronoi codebook of each layer may be at anytime chosen to have a dynamically varying size and may be derived from a different lattice.

It has also been shown how to optimally decode a set of indices corresponding to entries in a set of voronoi codebooks, where each index provides an additional refinement to the already encoded indices.

The technology disclosed herein has several advantages, some of which are:

Low complexity
Low memory requirements
On the fly indexing
The described scheme allows forming of layered representations of the quantized source vector x, thus enabling the decoder to recover a low quality version of the source vector when part of the transmitted information does not reach the decoder.
The layered representation can be changed at any time without the need for redesigning codebooks or indexing tables. This allows the encoder to efficiently construct specific layered configurations on demand.
Alleviate the problem of lattice scaling and/or overload.

It will be understood by those skilled in the art that various modifications and changes may be made to the technology disclosed herein without departure from the scope thereof, which is defined by the appended claims.

APPENDIX I

This APPENDIX describes lattice division, i.e. dividing a lattice vector by an integer. The usefulness of the technique is based on the existence of fast algorithms for computation of nearest neighbors, as discussed in [ConwaySloane].

For an arbitrary vector x of dimension d, $y=Q_\Lambda(x)$ denotes the nearest neighbor of x in the lattice Λ. Consider a vector y∈Λ and a voronoi codebook $C_\Lambda(p,a)$, and let:

$$q = Q_\Lambda\left(\frac{y-a}{p}\right) \qquad (17)$$

which means that $y-a=pq+p\epsilon$, and $\epsilon$ belongs to the voronoi region $V_\Lambda(0)$. This is also equivalent to saying that:

$$y=pq+a+p\epsilon \qquad (18)$$

Now, since both y and q belong to the lattice Λ and p is an integer, it follows that $a+p\epsilon$ must also be a lattice point, and since $\epsilon \in V_\Lambda(0)$ we must have $r=a+p\epsilon \in C_\Lambda(p,a)$ and therefore:

$$y=pq+r \text{ with } r\in C_\Lambda(p,a) \qquad (19)$$

This way of decomposing the vector y is similar to Euclidian division and is actually equivalent to Euclidean division when the lattice is of dimension d=1. We call q the quotient and r the remainder of the division of y by the integer p. It should, however, be noted that both q and r are vectors when d>1.

Concerning the vector a, its function is to break ties, but usually it is also optimized such that the code energy is as small as possible. If $a \notin V_\Lambda(0)$, then by a simple translation one can write that a is the sum of a lattice point and a vector belonging to $V_\Lambda(0)$. The lattice point results therefore in a translated voronoi code, therefore, we assume without loss of generality that the vector lies in the voronoi region around the origin 0, i.e. that $a \in V_\Lambda(0)$.

In the following paragraphs the domain properties of lattice division will be explored.

Assume a vector y∈Λ, and let $a \in V_\Lambda(0)$. The set of all positive integers k such that $y \in C_\Lambda(k,a)$ is bounded below by the smallest possible positive integer n such that $y \in C_\Lambda(n,a)$. We call n the degree of y, which is denoted $\deg_a(y)$.

By using lattice division in accordance with (19), a vector y∈Λ, can be expressed as $y=pq+r$ with $r \in C_\Lambda(p,a)$, which shows that $\deg_a(r)$ must be less than or equal p. Now let $a' \in V_\Lambda(0)$, by definition $y \in C_\Lambda(\deg_{a'}(y), a')$. It can be shown that y−r belongs to $C_\Lambda(\deg_{a'}(y)+p, a'+a)$, consequently, one can show that:

$$q \in C_\Lambda\left(\frac{\deg_{a'}(y)}{p}+1, \frac{a'+a}{p}\right) \qquad (20)$$

Now, if p=1, it immediately follows that r=0 and q=y and therefore, $\deg_a(q)=\deg_a(y)$. Next, suppose that p≧2. Since a and a' belong to $V_\Lambda(0)$, it follows that $a'+a \in 2V_\Lambda(0)$ and $$b = \frac{a+a'}{p} \in (2/p)V_\Lambda(0) \subset V_\Lambda(0).$$

Hence:

$$q \in C_\Lambda\left(\frac{\deg_{a'}(y)}{p}+1, b\right) \text{ with } b \in V_\Lambda(0) \qquad (21)$$

It follows that, the degree of the quotient vector q must satisfy:

$$deg_b(q) \leq \frac{deg_{a'}(y)}{p} + 1 \quad (22)$$

for all positive integers p and for any lattice vector.

APPENDIX II

The lattice division algorithm, starting from an initial vector $y_0 \in \Lambda$ applies successive lattice divisions on the quotient of the previous lattice divisions by a set of positive integer. The assumption that the integers $p_i$ are at least equal to two is required, since any step for which $p_i=1$ leaves the result unchanged.

If we write $m_i = deg_{b_i}(y_i)$, with appropriately chosen vectors $b_1, b_2, \ldots \in V_\Lambda(0)$, then an iteration of the algorithm leads to the following:

$$m_{i+1} \leq \frac{m_i}{p_i} + 1 \text{ with } m_0 = deg_{b_0}(y_0) \quad (23)$$

Since by assumption, $p_i \geq 2$, one can get an upper bound on the degree evolution:

$$m_{i+1} \leq \frac{m_i}{p_i} + 1 \leq \frac{m_i}{2} + 1 \quad (24)$$

It can now be shown that:

$$m_i \leq \frac{m_0}{2^i} + 1 + \frac{1}{2} + \frac{1}{2^2} + \ldots + \frac{1}{2^{i-1}} = 1 + \frac{m_0 + 2^{i-1} + \ldots + 1}{2^i} \quad (25)$$

If k is the number of bits used to represent $m_0$, then for $i>k$ we necessarily have $m_i \leq 2$, i.e. $y_i \in C_\Lambda(2, b_i)$ for some $b_i$. This shows that the division algorithm always leads to points that belong to the voronoi code $y_i \in C_\Lambda(2, b_i)$, $i>k$.

If any $p_i, i>k$ is strictly greater than 2, then the algorithm converges to the codebook $C_\Lambda(1, b_i)$, which has as unique codevector the origin 0.

If all $p_i=2, i>k$, the algorithm will lead to $y_{k+1}=2y_{k+2}+r_{k+2}$. Then if $y_{k+1} \in C(2, a_{k+2})$, it necessarily follows that $y_{k+2}=0$ and the algorithm converges. Otherwise, if $y_{k+1} \notin C(2, a_{k+2})$, then we must have $-y_{k+1} \in C(2, a_{k+2})$ and immediately it follow that $y_{k+2}=y_{k+1}$ and $r_{k+2}=-y_{k+1}$ and the algorithm converges as well.

Thus, it follows that the algorithm always converges to either zero or another lattice point, which is contained in $2V_\Lambda(0)$.

APPENDIX III

A question that may arise is whether the generated code is unique. In order to answer this question, let us consider two iterations of the algorithm:

$$y_i = p_{i+1}y_{i+1} + r_{i+1} \text{ and } y_{i+1} = p_{i+2}y_{i+2} + r_{i+2} \quad (26)$$

Then we can write, $$y_i = p_{i+1}p_{i+2}y_{i+2} + p_{i+1}r_{i+2} + r_{i+1} = \tilde{p}_{i+1}\tilde{y}_{i+1} + \tilde{r}_{i+1} \quad (27)$$

Expression (27) shows that, if $\tilde{r}_{i+1}$ is a voronoi code, then two iterations of the algorithm are equivalent to one iteration with a integer $\tilde{p}_{i+1}$ which is the product of $p_{i+1}, p_{i+2}$. However, in general this is not the case, and one can only show that, $\tilde{r}_{i+1} \in C_\Lambda(\tilde{p}_{i+1}+1, \tilde{a}_{i+1})$, but this is only a bounding code and not all code vectors of $C_\Lambda(\tilde{p}_{i+1}+1, \tilde{a}_{i+1})$ are used.

Next we show that there is a one-to-one mapping between code vectors $\tilde{r}_{i+1}$ and the pair $(r_{i+1}, r_{i+2})$. In fact, we have that $\tilde{r}_{i+1} = p_{i+1}r_{i+2} + r_{i+1}$, and given that $r_{i+1} \in C_\Lambda(p_{i+1}, a_{i+1})$, it follows that $r_{i+2}$ is uniquely determined and so is $r_{i+1}$.

The fact that there is a one-to-one mapping is important since it means that no two $(r_{i+1}, r_{i+2})$ lead to the same $\tilde{r}_{i+1}$ and therefore the generated code is unique and efficient in this sense. The fact that $\tilde{r}_{i+1}$ is not necessarily a voronoi code leads to inefficiency in terms of the average mean square error, but this is a well-known price to pay for having a layered coding.

REFERENCES

[1] Conway J. H., Sloane N. J. A. "Fast Quantizing and Decoding Algorithms for Lattice Quantizers and Codes". IEEE transactions on Information Theory. VOL. IT-28, NO. 2, March 1982, pages 227-232.

[2] Adoul J.-P., Lamblin C., Leguyader A. "Baseband Speech Coding at 2400 bps using Spherical Vector Quantization". Proc. ICASSP 1984. pages 1.12.1-1.12.4

[3] Rault P., Guillemot C. "Indexing Algorithms for Zn, An, Dn and Dn++ Lattice Vector Quantizers". IEEE transactions on Multimedia. VOL. 3, NO. 4, December 2001, pages 395-404.

[4] Conway J. H., Sloane N. J. A. "A Fast Encoding Method for Lattice Codes and Quantizers". IEEE transactions on Information Theory. VOL. IT-29, NO. 6 Nov. 1983, pages 820-824.

[5] D. Mukherjee and S. K. Mitra "Successive Refinement Lattice Vector Quantization". IEEE transactions on Image Processing. VOL. 11, NO. 12, December 2002, pages 1337-1348.

[6] WO 03/103151

[7] U.S. Pat. No. 6,516,297 B1

[8] S. N. Diggavi, N. J. A. Sloane, V. A. Vaishampayan. "Asymmetric Multiple Description Lattice Vector Qauntizers". IEEE transactions on Information Theory, VOL. 48, NO. 1, January 2002. pages 174-191.

The invention claimed is:

1. An encoding method comprising the steps of:
quantizing a vector x by:
approximating a vector x by a lattice vector $y_0$ belonging to a lattice $\Lambda_0$;
successively decomposing said lattice vector $y_0$ into a sequence of quotient vectors $y_i$ and a sequence of remainder vectors $r_i$ on successive lattices $\Lambda_{i-1}$ by lattice division with integers from a corresponding predetermined sequence of integers $p_i \geq 2$, where i= 1 . . . k and k is a positive integer greater than 1 representing the number of elements in each sequence, and where each successive decomposition is obtained in accordance with:

$$\begin{cases} y_i = Q_{\Lambda_{i-1}}\left(\frac{y_{i-1} - a_i}{p_i}\right) \\ r_i = y_{i-1} - p_i y_i \end{cases}$$

where $$Q_{\Lambda_{i-1}}\left(\frac{y_{i-1} - a_i}{p_i}\right)$$

denotes quantization of vector $$\frac{y_{i-1} - a_i}{p_i}$$

to lattice $\Lambda_{i-1}$, and where $a_i$ is a predetermined displacement vector belonging to the voronoi region $V_{\Lambda_{i-1}}(0)$ of lattilce $\Lambda_{i-1}$ and selected to break ties in such a way that no lattice point lies on the boundary of $p_i V_{\Lambda_{i-1}}(0) + a_i$;

coding each remainder vector $r_i$ in a corresponding voronoi codebook $V_{\Lambda_{i-1}}(p_i, a_i)$;

representing said vector x by a set of parameters that include said coded remainder vectors $r_i$, the number k of such remainder vectors $r_i$ and said sequence of integers $p_i$ and displacement vectors $a_i$ defining said voronoi codebooks $V_{\Lambda_{i-1}}(p_i, a_i)$.

2. The vector quantization method of claim 1, wherein all lattices $\Lambda_{i-1}$ are the same lattice $\Lambda$.

3. An encoding method, including the steps of:
quantizing a vector x in accordance with the vector quantization method of claim 2;
coding each remainder vector $r_i$ in a corresponding voronoi codebook $V_{\Lambda_{i-1}}(p_i, a_i)$;
representing said vector x by a set of parameters that include said coded remainder vectors $r_i$, the number k of such remainder vectors $r_i$ and said sequence of integers $p_i$ and displacement vectors $a_i$ defining said voronoi codebooks $V_{\Lambda_{i-1}}(p_i, a_i)$.

4. The encoding method of claim 1, further comprising coding said remainder vectors $r_i$ as:

$$n_i = [G_{i-1}^{-1} r_i] \bmod p_i, \quad i = 1 \ldots k$$

where $G_{i-1}$ is the generator matrix of lattice $\Lambda_{i-1}$.

5. The encoding method of claim 4, further comprising forwarding said coded remainder vectors $r_i$ and the number k of such remainder vectors $r_i$ to a decoder.

6. The encoding method of claim 5, further comprising forwarding a sign bit b representing the sign of the last remainder vector $r_k$ to said decoder.

7. A decoding method comprising the steps of:
receiving coding parameters representing a vector x encoded in accordance with the encoding method of claim 1; and
reconstructing an approximation y of said vector x in accordance with:

$$y = \sum_{i=1}^{l} \left(\prod_{j=1}^{i-1} p_j\right) \bar{r}_i + \sum_{i=l+1}^{k} \left(\prod_{j=1}^{i-1} p_j\right) r_i.$$

where $1 \leq k$ is a positive integer representing a number of missing coded remainder vectors and $\bar{r}_i$, $i = 1 \ldots l$ denotes the average of the code vectors in the corresponding voronoi codebook $C_{\Lambda_{i-1}}(p_i, a_i)$.

8. The decoding method of claim 7, further comprising receiving only coded remainder vectors $r_i$ and the number k of such remainder vectors $r_i$ and retrieving said set of integers $p_i$ and said displacement vectors $a_i$ from a storage unit at the receiving end.

9. An encoding method comprising using at least one of a processor, an Application Specific Integrated Circuit, and a Field Programmable Gate Array to perform the steps of claim 7.

10. A vector quantizer comprising:
a lattice quantizer approximating a vector x by a lattice vector $y_0$ belonging to a lattice $\Lambda_0$; and
a lattice vector decomposer connected to said lattice quantizer and configured to successively decompose said lattice vector $y_0$ into a sequence of quotient vectors $y_i$ and a sequence of remainder vectors $r_i$ on successive lattices $\Lambda_{i-1}$ by lattice division with integers from a corresponding predetermined sequence of integers $p_i \geq 2$, where $i = 1 \ldots k$ and k is a positive integer greater than 1 representing the number of elements in each sequence, and where each successive decomposition is obtained in accordance with:

$$\begin{cases} y_i = Q_{\Lambda_{i-1}}\left(\frac{y_{i-1} - a_i}{p_i}\right) \\ r_i = y_{i-1} - p_i y_i \end{cases}$$

where $$Q_{\Lambda_{i-1}}\left(\frac{y_{i-1} - a_i}{p_i}\right)$$

denotes quantization of vector $$\frac{y_{i-1} - a_i}{p_i}$$

to lattice $\Lambda_{i-1}$, and where $a_i$ is a predetermined tie breaking displacement vector belonging to the voronoi region $V_{\Lambda_{i-1}}(0)$ of lattice $\Lambda_{i-1}$ and selected to break ties in such a way that no lattice point lies on the boundary of $p_i V_{\Lambda_{i-1}}(0) + a_i$;

a voronoi lattice encoder connected to said vector quantizer for coding each remainder vector $r_i$ in a corresponding voronoi codebook.

11. The encoder of claim 1 further comprising a voronoi lattice encoder for coding said remainder vectors $r_i$ as:

$$n_i = [G_{i-1}^{-1} r_i] \bmod p_i, \quad i = 1 \ldots k$$

where $G_{i-1}$ is the generator matrix of lattice $\Lambda_{i-1}$.

12. A decoder comprising a vector reconstruction unit for reconstructing an approximation y of a vector x represented by received coding parameters encoded by an encoder in accordance with claim 10 as:

$$y = \sum_{i=1}^{l} \left(\prod_{j=1}^{i-1} p_j\right) \bar{r}_i + \sum_{i=l+1}^{k} \left(\prod_{j=1}^{i-1} p_j\right) r_i.$$

where $1 \leq k$ is a positive integer representing a number of missing coded remainder vectors and $\bar{r}_i$, $i = 1 \ldots l$ denotes the average of the code vectors in the corresponding voronoi codebook $C_{\Lambda_{i-1}}(p_i, a_i)$.

13. A decoder including a vector reconstruction unit for reconstructing an approximation y of a vector x represented by received coding parameters encoded by an encoder in accordance with claim 11 as:

$$y = \sum_{i=1}^{l}\left(\prod_{j=1}^{i-1} p_j\right)\bar{r}_i + \sum_{i=l+1}^{k}\left(\prod_{j=1}^{i-1} p_j\right)r_i.$$

where $1 \leq k$ is a positive integer representing a number of missing coded remainder vectors and $\bar{r}_i$, $i=1\ldots l$ denotes the average of the code vectors in the corresponding voronoi codebook $C_{A_{i-1}}(p_i, a_i)$.

14. An encoding method comprising using at least one of a processor, an Application Specific Integrated Circuit, and a Field Programmable Gate Array to perform the steps of claim 1.

15. An encoding method comprising using at least one of a processor, an Application Specific Integrated Circuit, and a Field Programmable Gate Array to perform the steps of claim 3.

* * * * *

UNITED STATES PATENT AND TRADEMARK OFFICE
CERTIFICATE OF CORRECTION

PATENT NO. : 8,340,450 B2
APPLICATION NO. : 11/991539
DATED : December 25, 2012
INVENTOR(S) : Taleb Page 1 of 1

It is certified that error appears in the above-identified patent and that said Letters Patent is hereby corrected as shown below:

In the Specifications:

In Column 6, Line 60, delete "$C_\Lambda(2,a_{1+1})$," and insert -- $C_\Lambda(2,a_{i+1})$, --, therefor.

In Column 14, Line 7, delete "$(r_{i+1},r_{i+2})$" and insert -- $(r_{i+1},r_{i+2})$. --, therefor.

Signed and Sealed this
Ninth Day of July, 2013

Teresa Stanek Rea
*Acting Director of the United States Patent and Trademark Office*